United States Patent
Zhou

(10) Patent No.: US 10,257,447 B2
(45) Date of Patent: Apr. 9, 2019

(54) IMAGING METHOD, IMAGING DEVICE, AND ELECTRONIC DEVICE

(71) Applicant: GUANGDONG OPPO MOBILE TELECOMMUNICATIONS CORP., LTD., Dongguan (CN)

(72) Inventor: Qiqun Zhou, Dongguan (CN)

(73) Assignee: GUANGDONG OPPO MOBILE TELECOMMUNICATIONS CORP., LTD., Dongguan, Guangdong (CN)

(*) Notice: Subject to any disclaimer, the term of this patent is extended or adjusted under 35 U.S.C. 154(b) by 0 days.

(21) Appl. No.: 15/514,798

(22) PCT Filed: Jul. 27, 2016

(86) PCT No.: PCT/CN2016/091944
§ 371 (c)(1),
(2) Date: Mar. 27, 2017

(87) PCT Pub. No.: WO2017/101451
PCT Pub. Date: Jun. 22, 2017

(65) Prior Publication Data
US 2017/0332022 A1    Nov. 16, 2017

(30) Foreign Application Priority Data
Dec. 18, 2015 (CN) .......................... 2015 1 0964215

(51) Int. Cl.
*H04N 5/347* (2011.01)
*H04N 9/04* (2006.01)
(Continued)

(52) U.S. Cl.
CPC ............. *H04N 5/347* (2013.01); *H01L 27/00* (2013.01); *H04N 5/243* (2013.01); *H04N 9/04* (2013.01); *H04N 9/045* (2013.01)

(58) Field of Classification Search
CPC ....... H04N 2209/045; H04N 2209/046; H04N 5/3458; H04N 5/3537; H04N 9/67;
(Continued)

(56) References Cited

U.S. PATENT DOCUMENTS 6,999,119 B1    2/2006    Shibazaki et al.
9,787,952 B2 *  10/2017   Hsu .................. H04N 9/045
(Continued)

FOREIGN PATENT DOCUMENTS

CN    101170644 A    4/2008
CN    101321295 A    12/2008
(Continued)

OTHER PUBLICATIONS

Japanese Patent Application No. 2017528779 Notification of Reasons for Refusal dated Dec. 26, 2017, 5 pages.
(Continued)

*Primary Examiner* — Shahbaz Nazrul
(74) *Attorney, Agent, or Firm* — Lathrop Gage LLP

(57) ABSTRACT

The present disclosure discloses an imaging method. The imaging method comprises: providing an image sensor, the image sensor comprising a photosensitive pixel array and a filter arranged on the photosensitive unit array, the filter comprising a filter cell array, and each filter cell covering a plurality of photosensitive pixels to form a merged pixel; and reading outputs of the photosensitive pixel array, and adding the outputs of the photosensitive pixels of the same merged pixel to obtain a pixel value of the merged pixel, thereby producing a merged image. Images, having higher signal to noise ratio, brightness, and definition, and less noise, can be captured by using the imaging method in low light. The present disclosure also discloses an imaging device using the imaging method and an electronic device using the imaging device.

16 Claims, 11 Drawing Sheets

(51) Int. Cl.
*H01L 27/00* (2006.01)
*H04N 5/243* (2006.01)

(58) Field of Classification Search
CPC .......... H04N 9/76; H04N 9/045; H04N 5/347; H04N 9/04; H04N 5/243; G06T 3/4015; H01L 27/14621; H01L 27/00; H01L 27/14607

See application file for complete search history.

(56) References Cited

U.S. PATENT DOCUMENTS

| | | | | |
|---|---|---|---|---|
| 9,793,313 | B2* | 10/2017 | Ishiwata | H01L 27/14621 |
| 9,866,771 | B2* | 1/2018 | Mabuchi | H04N 5/35563 |
| 2006/0125947 | A1* | 6/2006 | Packer | H01L 27/14627 348/340 |
| 2007/0206241 | A1 | 9/2007 | Smith et al. | |
| 2009/0167917 | A1 | 7/2009 | Miki et al. | |
| 2009/0200451 | A1 | 8/2009 | Conners | |
| 2010/0253833 | A1 | 10/2010 | Deever et al. | |
| 2011/0052095 | A1 | 3/2011 | Deever | |
| 2011/0273597 | A1* | 11/2011 | Ishiwata | H01L 27/14603 348/272 |
| 2012/0113290 | A1 | 5/2012 | Nakata | H04N 5/35554 348/222.1 |
| 2012/0193515 | A1* | 8/2012 | Agranov | G01S 3/782 250/208.1 |
| 2015/0002709 | A1* | 1/2015 | Masagaki | H04N 9/045 348/280 |
| 2015/0062422 | A1* | 3/2015 | Stern | H04N 5/2254 348/374 |
| 2015/0189200 | A1* | 7/2015 | Jin | H04N 9/045 348/46 |
| 2015/0312461 | A1* | 10/2015 | Kim | H01L 27/14609 348/308 |
| 2015/0312537 | A1* | 10/2015 | Solhusvik | H04N 9/045 348/302 |
| 2015/0350583 | A1* | 12/2015 | Mauritzson | H04N 5/378 250/208.1 |

FOREIGN PATENT DOCUMENTS

| | | |
|---|---|---|
| CN | 102202222 A | 9/2011 |
| CN | 102460700 A | 5/2012 |
| CN | 104486602 A | 4/2015 |
| CN | 105430359 A | 3/2016 |
| CN | 105430360 A | 3/2016 |
| CN | 105430361 A | 3/2016 |
| CN | 105430362 A | 3/2016 |
| CN | 105430363 A | 3/2016 |
| CN | 105516697 A | 4/2016 |
| CN | 105554485 A | 5/2016 |
| CN | 105578006 A | 5/2016 |
| CN | 105578072 A | 5/2016 |
| CN | 105578076 A | 5/2016 |
| CN | 105578077 A | 5/2016 |
| CN | 105578080 A | 5/2016 |
| CN | 105578081 A | 5/2016 |
| CN | 105592303 A | 5/2016 |
| CN | 105611125 A | 5/2016 |
| CN | 105611185 A | 5/2016 |
| CN | 105611257 A | 5/2016 |
| DE | 102011100350 A1 | 11/2012 |
| JP | 2009017544 A | 1/2009 |
| JP | 2009529291 A | 8/2009 |
| JP | 2011205348 A | 10/2011 |

OTHER PUBLICATIONS

Japanese Patent Application No. 2017528779 English translation of Notification of Reasons for Refusal dated Dec. 26, 2017, 4 pages.
Singapore Patent Application No. 11201706110S Search and Opinion dated Dec. 18, 2017, 8 pages.
Chinese Patent Application No. 201510964215.X Office Action dated Apr. 6, 2017 with English translation, 11 pages.
Chinese Patent Application No. 201510964215.X Office Action dated Nov. 7, 2016 with English translation, 13 pages.
PCT/CN2016/091944 English Translation of International Search Report & Written Opinion dated Oct. 31, 2016, 7 pages.
Australian Patent Application No. 2016370324 Examination Report dated May 11, 2018, 3 pages.
European Patent Application No. 16874512.3 extended Search and Opinion dated Mar. 21, 2018, 6 pages.

* cited by examiner

IMAGING METHOD, IMAGING DEVICE, AND ELECTRONIC DEVICE

CROSS-REFERENCE TO RELATED APPLICATION

This application claims priority to and benefits of Chinese Patent Application Serial No. 201510964215.X, filed with the State Intellectual Property Office of P. R. China on Dec. 18, 2015, the entire contents of which are incorporated herein by reference.

FIELD

The present disclosure relates to imaging technologies, and particularly, to an imaging method, an imaging device, and an electronic device.

BACKGROUND

Images produced by an image sensor of a conventional imaging device, may have noise and lack clarity, in a low-luminance environment.

SUMMARY

The present disclosure aims to solve at least one of the problems existing in the prior art to some extent at least. The present disclosure provides an imaging method, an imaging device, and an electronic device.

The imaging method of embodiments of the present disclosure includes the following steps of:

providing an image sensor, the image sensor comprising a photosensitive pixel array and a filter arranged on the photosensitive unit array, the filter comprising a filter cell array, and each filter cell covering a plurality of photosensitive pixels to form a merged pixel; and reading outputs of the photosensitive pixel array, and adding the outputs of the photosensitive pixels of the same merged pixel to obtain a pixel value of the merged pixel, thereby producing a merged image.

Because the noise of the merged pixel is less than a sum of noise of each photosensitive pixel before being merged, images, having higher signal to noise ratio, brightness, and definition, and less noise, can be captured by using the imaging method in low light. The shortcomings of some exist imaging methods can be overcome.

In some embodiments, the imaging device comprises a register, each filter cell covers 2 by 2 photosensitive pixels;

the step of reading further comprises:

gathering and storing the outputs of the photosensitive pixels of rows k and k+1 into the register, wherein k=2n−1, n is a natural number, k+1 is less than or equal to the total row of the photosensitive pixels; and extracting the outputs of the photosensitive pixels of rows k and k+1 from the register, and adding the outputs of the photosensitive pixels of the same merged pixel to obtain a pixel value of the merged pixel.

In some embodiments, the step of reading further comprises:

converting analog signal outputs of the photosensitive pixels into digital signal outputs.

The imaging device comprises:

an image sensor, the image sensor comprises:

a photosensitive pixel array;

a filter arranged on the photosensitive pixel array, the filter comprising a filter cell array, each filter cell covering a plurality of photosensitive pixels to form a merged pixel; and an image processing module coupled with the image sensor, and the image processing module configured to read outputs of the photosensitive pixel array, and add the outputs of the photosensitive pixels of the same merged pixel to obtain a pixel value of the merged pixel, thereby producing a merged image.

Because the noise of the merged pixel is less than a sum of noise of each photosensitive pixel before being merged, images, having higher signal to noise ratio, brightness, and definition, and less noise, can be captured by using the imaging method in low light. The shortcomings of some existing imaging methods can be overcome.

In some embodiments, the image sensor comprises a CMOS sensor.

In some embodiments, the filter cell array comprises a Bayer array.

In some embodiments, each filter cell covers 2 by 2 photosensitive pixels.

In some embodiments, the imaging device comprises a control module. The control module is configured to control the line-by-line exposure of the photosensitive pixel array.

In some embodiments, the imaging device comprises a register. The control module is configured to sequentially gather the outputs of the photosensitive pixels of rows k and k+1, which are completed by current exposure, and store the outputs into the register. Wherein k=2n−1, n is a natural number, and k+1 is less than or equal to the total row of the photosensitive pixel array.

In some embodiments, the imaging sensor comprises an analog-to-digital converter. Each photosensitive pixel is connected to an analog-to-digital converter. The analog-to-digital converter is configured to convert analog signal outputs of the photosensitive pixels into digital signal outputs. The digital signal outputs are configured to be stored in the register. The image processing module is configured to add the digital signal outputs of the photosensitive pixels of the same merged pixel to obtain a pixel value of the merged pixel.

In some embodiments, the image sensor comprises a micro-lens array arranged on the filter. Each micro-lens corresponds to a photosensitive pixel.

The present disclosure also provides an electronic device. The electronic device comprises the imaging device.

Using the electronic device of the embodiments of the present disclosure, advantages of the imaging method and the imaging device of the embodiments of the present disclosure can be realized.

In some embodiments, the electronic device comprises a cell phone.

In some embodiments, the imaging device comprises a front-facing camera of the cell phone.

In some embodiments, the electronic device comprises a central processing unit and an external storage connected to the imaging device. The central processing unit is configured to control the external storage to store the merged image.

In some embodiments, the electronic device comprises a central processing unit and a display device connected to the imaging device. The central processing unit is configured to control the display device to display the merged image.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
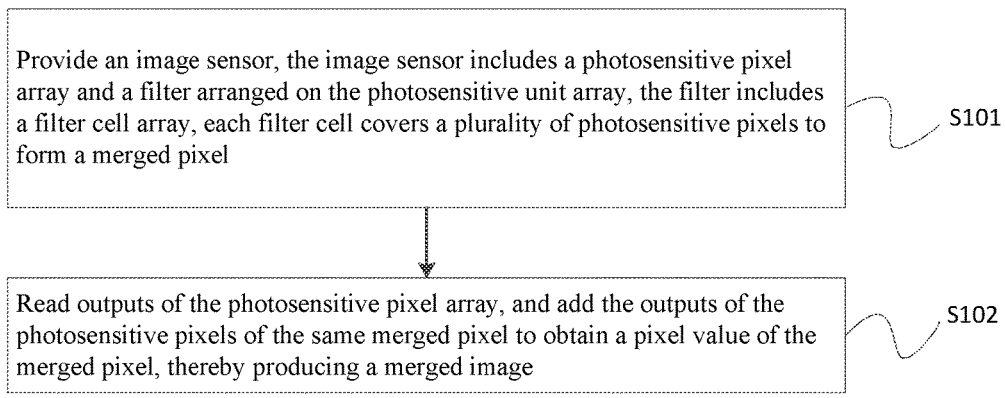
FIG. 1 is a flow chart of an imaging method, according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

An imaging method, an image sensor, and an electronic device provided by embodiments of the present disclosure will be described with reference to the accompanying drawings as follows.

Referring to FIG. 1, an imaging method of an embodiment of the present disclosure includes the following steps:

S101: provide an image sensor. The image sensor includes a photosensitive pixel array and a filter arranged on the photosensitive unit array. The filter includes a filter cell array. Each filter cell covers a plurality of photosensitive pixels to form a merged pixel.

S102: read outputs of the photosensitive pixel array, and add the outputs of the photosensitive pixels of the same merged pixel to obtain a pixel value of the merged pixel, thereby producing a merged image.

The imaging method of the embodiment of the present disclosure, assuming the output of each original photosensitive pixel is represented as S, the noise is represented as N, and the merged pixel includes n by m photosensitive pixels, the pixel value of the merged pixel can be represented as n*m*S, and the noise of the merged pixel is represented as $$\frac{\sqrt{n*m*N^2}}{n*m}.$$

In a case that n=2, and m=2, the noise of the merged pixel is about N/2. Therefore, the brightness of the merged pixel in a low-luminance environment is improved, and the signal to noise ratio is improved.

Figure 2:
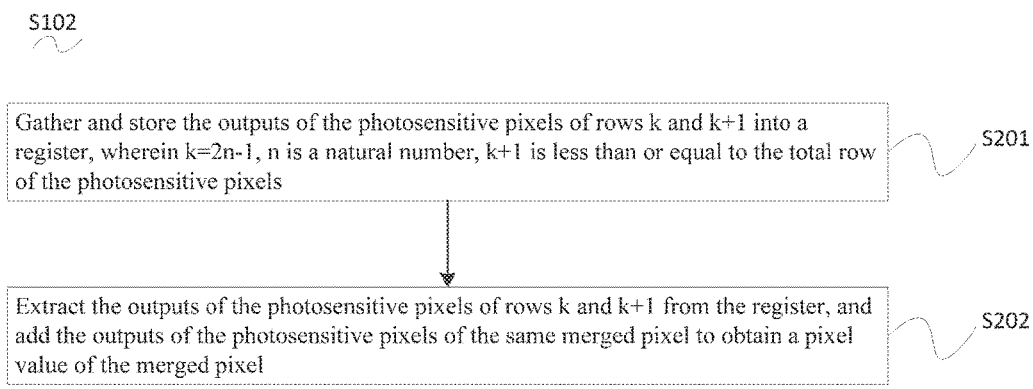
FIG. 2 is a flow chart of a reading step of an imaging method, according to an embodiment of the present disclosure.

Referring to FIG. 2, in some embodiments, each filter cell of the image sensor covers 2 by 2 photosensitive pixels. The step of S102 further includes:

S201, gather and store the outputs of the photosensitive pixels of rows k and k+1 into a register, wherein k=2n−1, n is a natural number, k+1 is less than or equal to the total row of the photosensitive pixels.

S202, extract the outputs of the photosensitive pixels of rows k and k+1 from the register, and add the outputs of the photosensitive pixels of the same merged pixel to obtain a pixel value of the merged pixel.

Thus, a process of reading, caching, and combining the outputs of the photosensitive unit can be achieved using the register.

Figure 3:
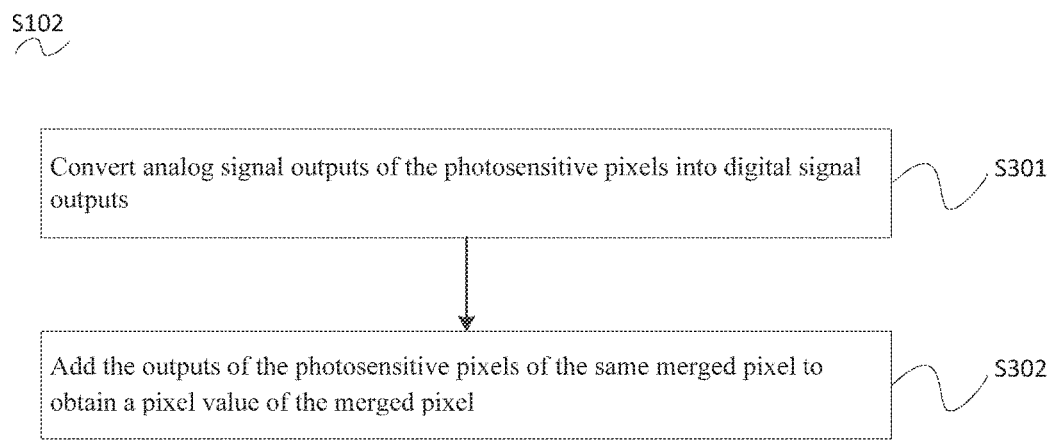
FIG. 3 is a flow chart of a reading step of an imaging method, according to an embodiment of the present disclosure.

Referring to FIG. 3, in some embodiments, the step of S102 further includes:

S301, convert analog signal outputs of the photosensitive pixels into digital signal outputs; and S302, add the outputs of the photosensitive pixels of the same merged pixel to obtain a pixel value of the merged pixel.

Thus, an image processing module of a digital signal processing chip can directly process outputs of the image sensor. And, compared with some solutions of directly processing the outputs of the image sensor with an analog signal format through a circuit, the information gathered by each of the photosensitive pixels of a front-end image sensor, is better reserved in a manner that an image processing module of a back-end digital signal processing chip processes outputs of the image sensor.

In this way, it is possible to generate a high-resolution image by using the information gathered by each of the photosensitive pixels alone, or to generate an image with low resolution, high signal to noise ratio, and high definition by combining some of the photosensitive pixels. For example, for an image sensor with 16M pixels, the imaging method of the present disclosure can both generate a merged image with 4M pixels (which combines the 2 by 2 pixels), and generate an original image with 16M pixels (which is not combined).

The imaging method of the embodiment of the present disclosure can be realized by the imaging device 100, according to an embodiment of the present disclosure.

Figure 4:
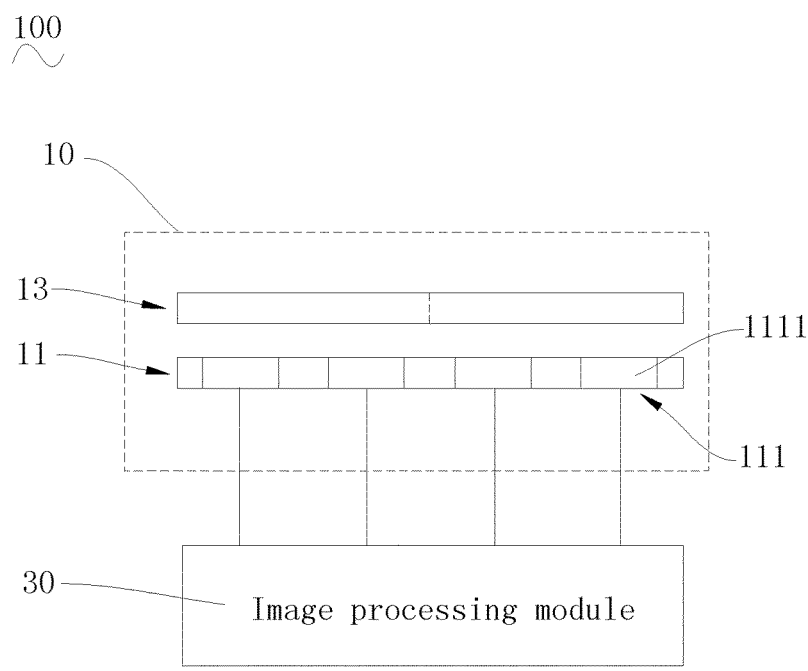
FIG. 4 is a structure diagram of an imaging device, according to an embodiment of the present disclosure.
Figure 5:
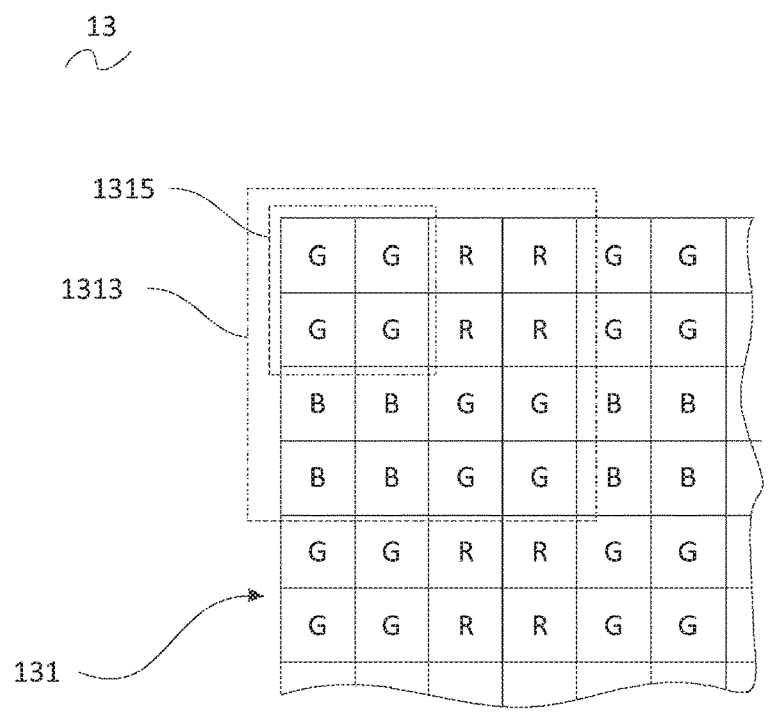
FIG. 5 is a schematic diagram of a filter cell array of an imaging device, according to an embodiment of the present disclosure.

Referring to FIG. 4 and FIG. 5, an imaging device of an embodiment of the present disclosure includes an image sensor 10 and an image processing module 30 coupled with the image sensor 10. The image sensor 10 includes a photosensitive pixel array 11 and a filter 13 arranged on the photosensitive pixel array 11. The filter 13 includes a filter cell array 131. Each filter cell 1315 covers a plurality of photosensitive pixels 111 to form a merged pixel. The image processing module 30 is configured to read outputs of the photosensitive pixel array 11, and add the outputs of the photosensitive pixels 111 of the same merged pixel to obtain a pixel value of the merged pixel, thereby producing a merged image.

The imaging device 100 of the present disclosure merges the outputs of multiple photosensitive pixels 111 and makes the outputs as the pixel value of the merged pixel. Compared with a traditional imaging device, the imaging device 100 of the present disclosure generates an image having lower noise, higher signal to noise ratio, and higher definition, in a low-luminance environment.

The image sensor 10 of the embodiment of the present disclosure can be a CMOS sensor. The CMOS sensor has low power, small size camera system, and low cost.

Referring to FIG. 5, in some embodiments, the filter cell array 131 includes a Bayer array (Bayer pattern). Bayer array is a common filter cell array structure. In the Bayer array, the filter cell 1315 includes green(G), red(R), and blue(B) filter cells. Wherein, two green filter cells, one red filter cell, and a blue filter cell form a filter structure 1313.

Using a Bayer structure, traditional algorithms for the Bayer structure can be employed to process image signals so that there is no need to make a major adjustment on hardware structures.

Figure 6:
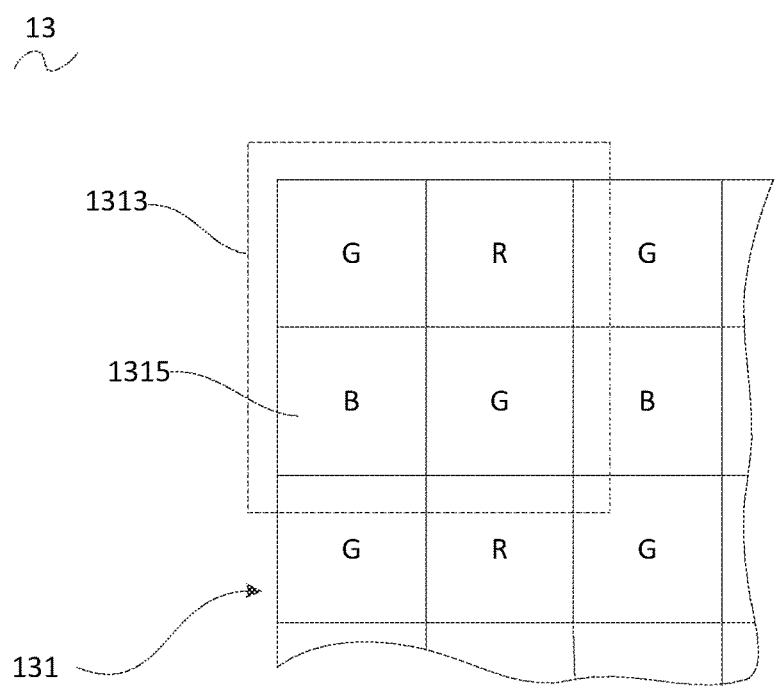
FIG. 6 is a schematic diagram of a Bayer array.

Referring to FIG. 6, in a traditional filter cell array 131, each filter structure 1313 includes four filter cells 1315. Each filter cell 1315 corresponds to a photosensitive pixel and an image pixel. Referring to FIG. 5, in this embodiment, the filter cell array 131 can apply a Bayer structure. But the difference is that each filter cell 1315 corresponds to a plurality of photosensitive pixel 111.

Figure 7:
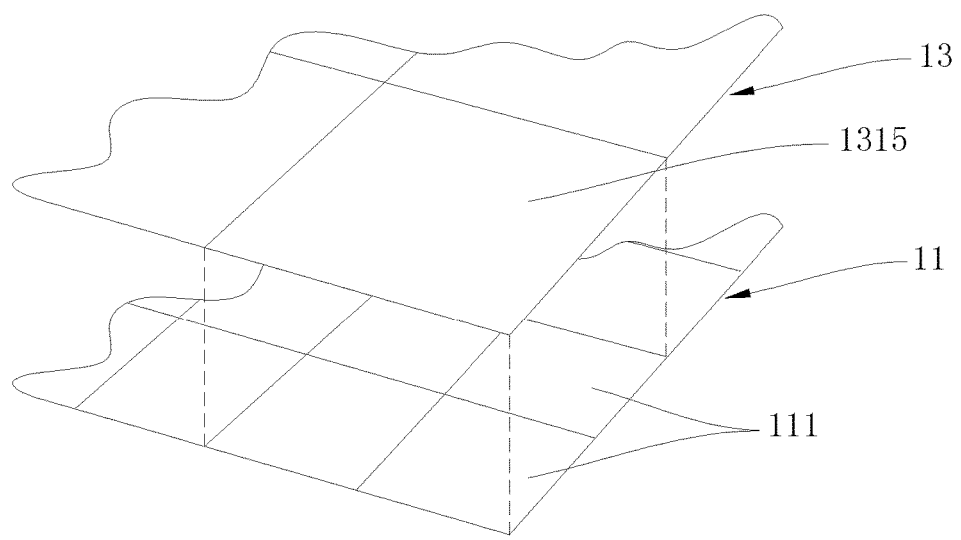
FIG. 7 is a dimensional structure diagram of an image sensor of an imaging device, according to an embodiment of the present disclosure.

Referring to FIG. 5 and FIG. 7, in some embodiments, each filter cell 1315 corresponds to 2 by 2 photosensitive pixels 111 to form a merged pixel.

Wherein, because a small difference of the light, four photosensitive pixels 111 corresponding to each filter cell 1315 may have different outputs. Thus, the output of the merged pixel synthesizes the outputs of the 2 by 2 photosensitive pixels 111.

Using a merged pixel structure of the embodiment, the image noise can be significantly reduced; and the signal to noise ratio and the definition can be increased, in the low-luminance.

In addition to the 2*2 structure, the arrangement of the multiple photosensitive pixels 111 in the merged pixel structure may be a 3*3, 4*4, or even any n*m structure (n, m are natural numbers). It is understood that the number of the photosensitive pixels 111 which can be arranged on the photosensitive pixel array 11 is limited. If each merged pixel includes too many photosensitive pixels 111, the resolution of the image will be limited. For example, if the pixel value of the photosensitive pixel array 11 is about 16M, the merged pixel structure with 2*2 will get a merged image with resolution of 4M, and the merged pixel structure with 4*4 will just get a merged image with resolution of 1M.

Thus, the merged pixel structure with 2*2 is a better arrangement, and tries to increase the image brightness and the definition while less sacrificing the resolution.

Figure 8:
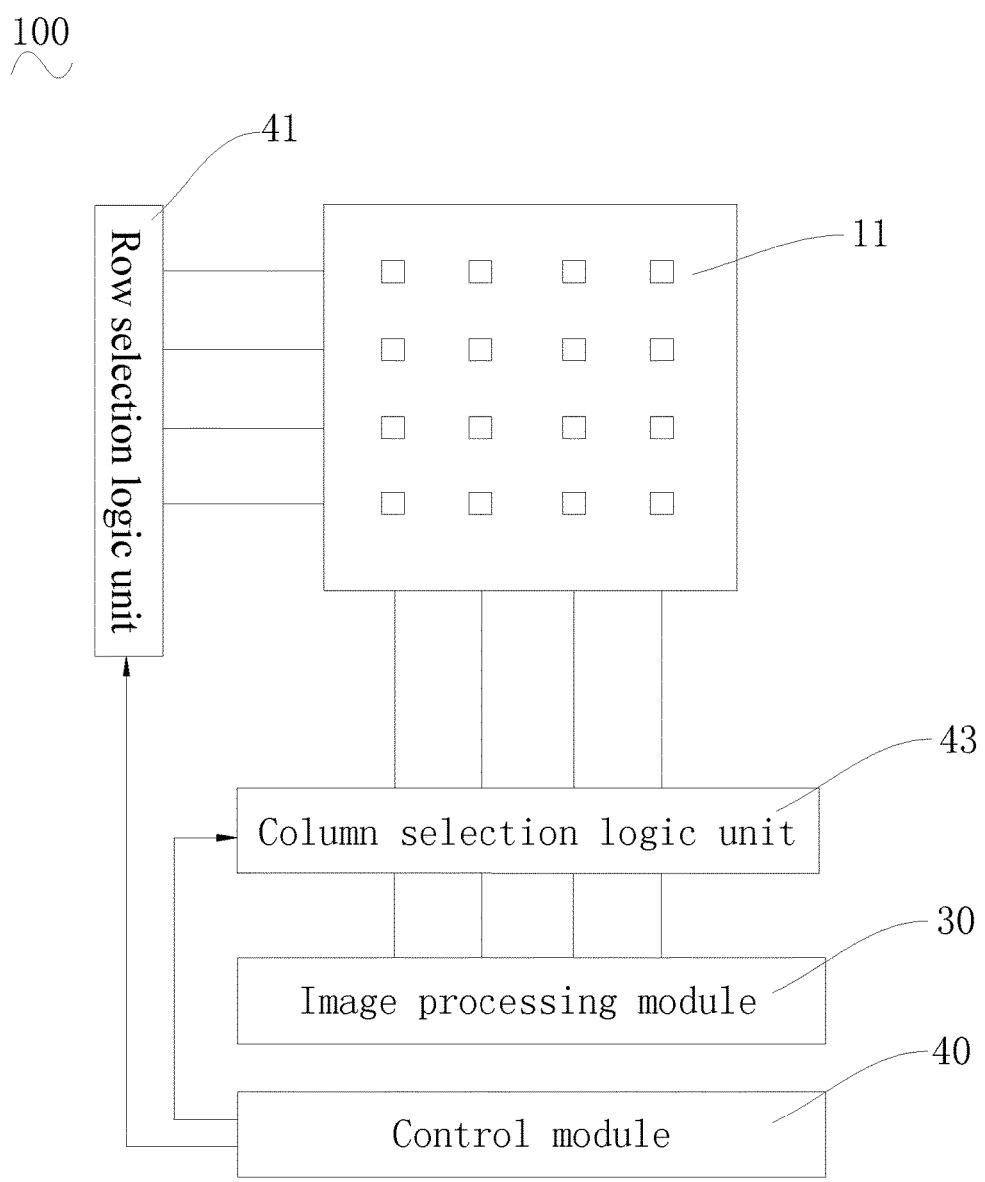
FIG. 8 is a functional block diagram of an imaging device, according to an embodiment of the present disclosure.

Referring to FIG. 8, in some embodiments, the imaging device 100 also includes a control module 40. The control module 40 is configured to control the line-by-line exposure of the photosensitive pixel array 11. The control module 40 is connected to a row selection logic unit 41 and a column selection logic unit 43 to process the outputs of the photosensitive pixels 111 line by line. The way of the line-by-line exposure and output makes the circuit easier to implement.

Figure 11:
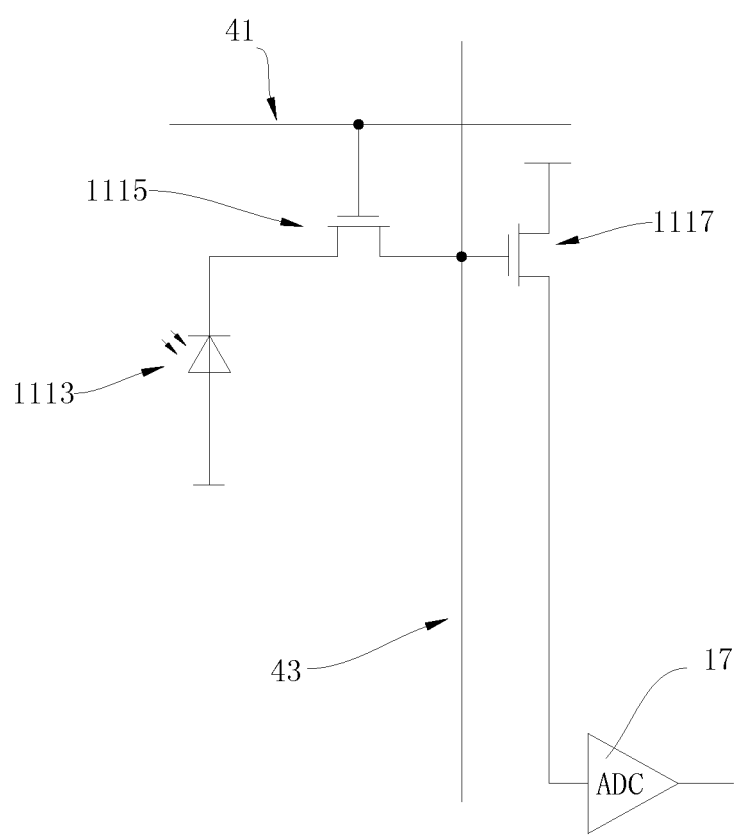
FIG. 11 is a schematic diagram of photosensitive pixels and a related circuit of an imaging device, according to an embodiment of the present disclosure.

Specifically, referring to FIG. 8 and FIG. 11, in this embodiment, the imaging device 100 includes a control module 40 connected to a row selection logic unit 41 and a column selection logic unit 43. The row selection logic unit 41 and the column selection logic unit 43 are connected to a switch tube 1115 corresponding to each of the photosensitive pixels. The control module 40 is configured to control the row selection logic unit 41 and the column selection logic unit 43 to select a switch tube 1115 of the photosensitive pixel at a specific position, for example, controls the switch tubes 1115 of the photosensitive pixels at the first row to close, and controls the switch tubes 1115 of the photosensitive pixels at other rows to open, to make the first photosensitive pixel output.

Figure 9:
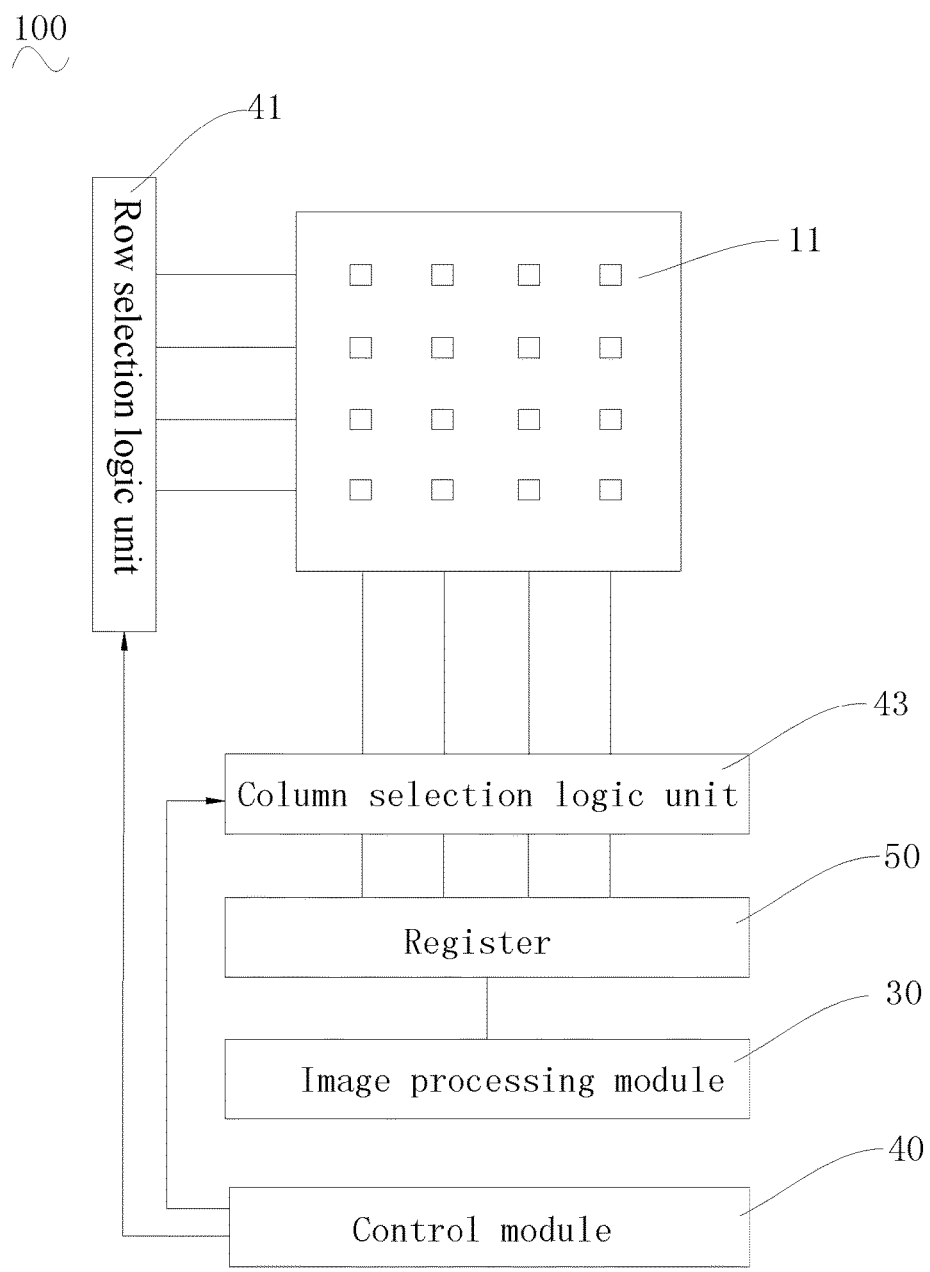
FIG. 9 is a functional block diagram of an imaging device, according to an embodiment of the present disclosure.

Referring to FIG. 9, in this embodiment, the imaging device 100 also includes a register 50. The control module 40 is configured to sequentially gather the outputs of the photosensitive pixels 111 of rows k and k+1, which are completed by current exposure, and store the outputs into the register 50. Wherein k=2n−1, n is a natural number, k+1 is less than or equal to the total row of the photosensitive pixel array 11.

Specifically, the control module 40 first gathers outputs of the photosensitive pixels of the first row and the second row, and stores the outputs into the register 50. The image processing module 30 adds the outputs of the four photosensitive pixels, of which the position coordinates are 1-1, 1-2, 2-1, 2-2, to get the pixel value of the merged pixel. Wherein left number of the position coordinate is represented as the row, and the right number of the position coordinate is represented as the column.

It is understood that the pixel value of the merged pixel is the output of the merged pixel corresponding to the four photosensitive pixels, of which the position coordinates are 1-1, 1-2, 2-1, 2-2.

The image processing module 30 then adds the outputs of the four photosensitive pixels, of which the position coordinates are 1-1, 1-2, 2-1, 2-2, to get the pixel value of the merged pixel.

By that analogy, until the last set of four photosensitive pixels 111 of the first row and the second row are processed.

According to the above processing way, the image processing module processes the outputs of the photosensitive pixels of the third row, the fourth row, the fifth row, and the sixth row, until all of the photosensitive pixels are processed.

At this time, the image processing module generates a merged image according to the pixel value of all of the merged pixels.

Figure 10:
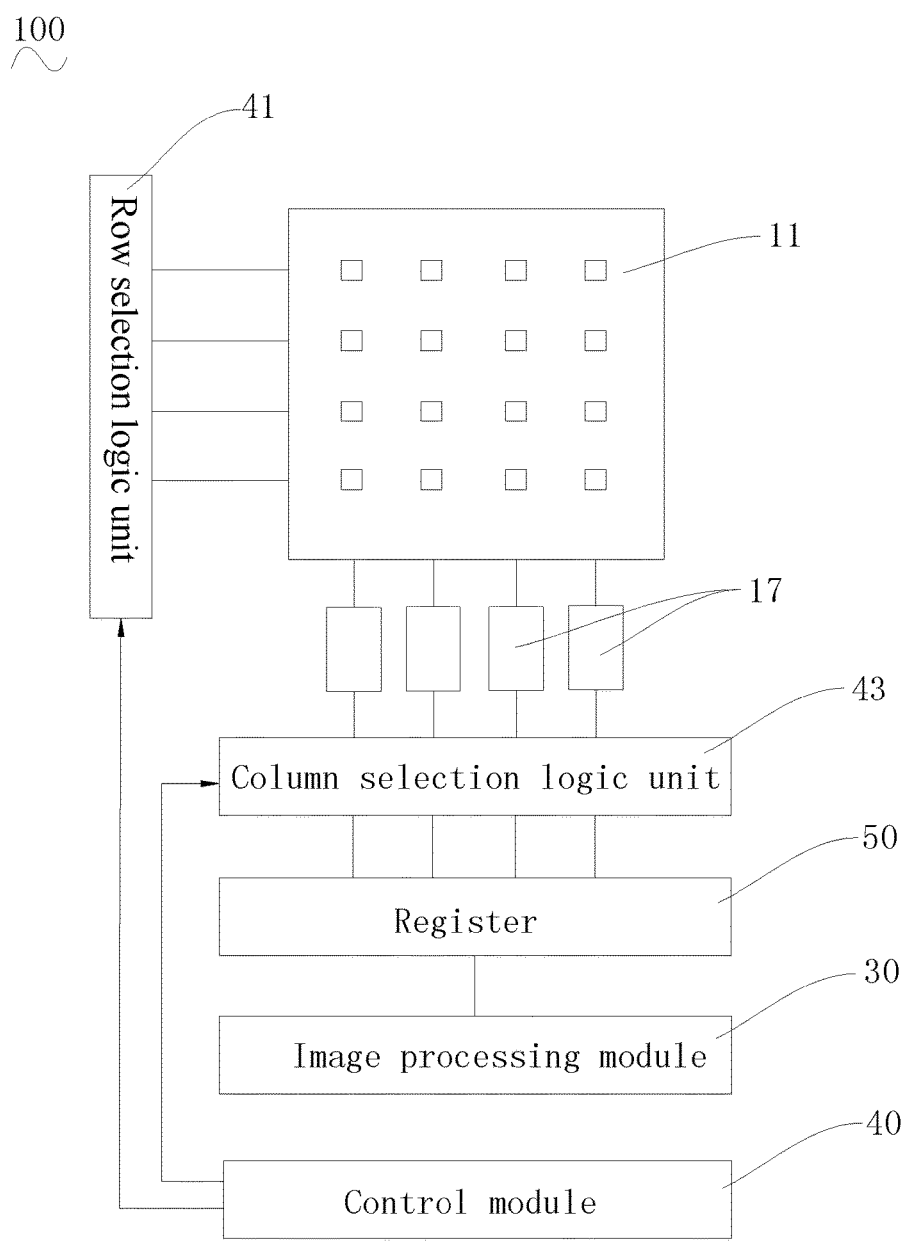
FIG. 10 is a functional block diagram of an imaging device, according to an embodiment of the present disclosure.

Referring to FIG. 10 and FIG. 11, in some embodiments, the imaging device 100 includes an analog-to-digital converter 17. Each photosensitive pixel 111 is connected to an analog-to-digital converter 17. The analog-to-digital converter 17 is configured to convert analog signal outputs of the photosensitive pixels 111 into digital signal outputs.

The photosensitive pixel of the present disclosure includes a photodiode 1113. The photodiode 1113 is configured to convert light into charge, and the charge is proportional to the light intensity. The switch tube 1115 is configured to control the circuit to be on and off according to control signals of the row selection logic unit 41 and the column selection logic unit 43. When the circuit is on, the source follower 1117 is configured to convert the charge signal produced by lighting the photodiode 1113 into a voltage signal. The analog-to-digital converter 17 is configured to convert the voltage signal into a digital signal, and transmits the digital signal to the image processing module 30 to be processed. The image processing module 30 includes an image signal processing chip (image signal processor).

Figure 12:
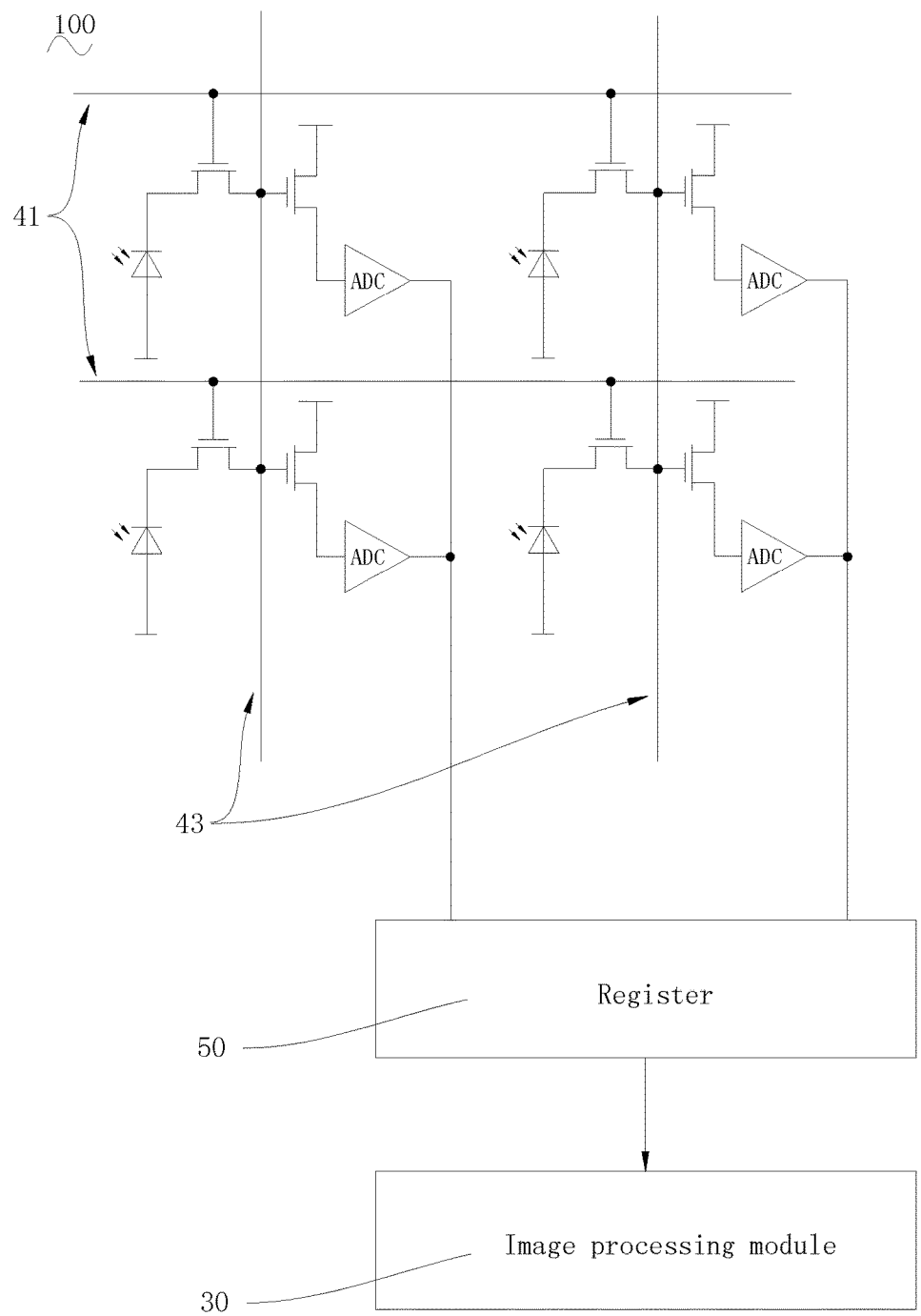
FIG. 12 is a schematic diagram of synthetic pixels and a related circuit of an imaging device, according to an embodiment of the present disclosure.

Specifically, referring to FIG. 11 and FIG. 12, the photosensitive pixels, of which the position coordinates are 1-1, 1-2, 2-1, 2-2, are represented as a merged pixel. The photodiode 1113 corresponding to each photosensitive pixel is connected to the switch tube 1115. The switch tube 1115 is configured to control the circuit to be on and off according to control signals of the row selection logic unit 41 and the column selection logic unit 43. When the circuit is on, the source follower 1117 is configured to convert the charge signal produced by lighting the photodiode 1113 into a voltage signal. The analog-to-digital converter 17 is configured to convert the voltage signal into a digital signal, and transmits the digital signal to the register 50.

In some embodiments, the outputs of the photosensitive pixels in the first row are parallel to the outputs of the corresponding photosensitive pixels in the second row. Thus, the outputs of the photosensitive pixels in the first row and the second row can not be gathered at the same time, and the control signals of the row selection logic unit 41 and the column selection logic unit 43 control the switch tubes 1115 of the photosensitive pixels in the first row to be on, and control the switch tubes 1115 of the photosensitive pixels in other rows to be off, to make the outputs of the photosensitive pixels in the first row be stored in the register 50, and then make the switch tubes 1115 of the photosensitive pixels in the second row to be on, and make the switch tubes 1115 of the photosensitive pixels in other rows to be off, to make the outputs of the photosensitive pixels in the second row be stored in the register. In this way, the register 50 gets the outputs of the photosensitive pixels of two rows, and then the image processing module 30 performs a calculation process for the outputs.

This output processing mode causes the outputs of the photosensitive pixels to enter the image processing module 30 and then be merged. For example, in the image signal processing chip, the pixel value of the merged pixel is obtained by combining the outputs of the photosensitive pixels by softwares. Therefore, the output information of each photoreceptor pixel is less likely to be lost, and the probability that the image appears bad points is low. In addition, this output processing mode has lower noise, and higher signal to noise ratio.

Figure 13:
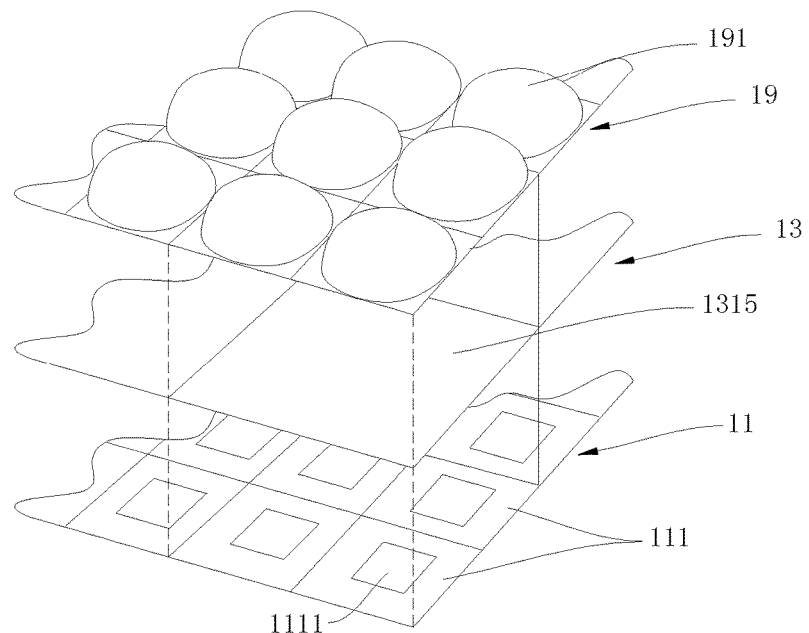
FIG. 13 is a dimensional structure diagram of an image sensor of an imaging device, according to an embodiment of the present disclosure.

Referring to FIG. 13, in some embodiments, the image sensor 10 includes a micro-lens array 19 arranged on the filter 13. Each micro-lens 191 corresponds to a photosensitive pixel 111.

Figure 14:
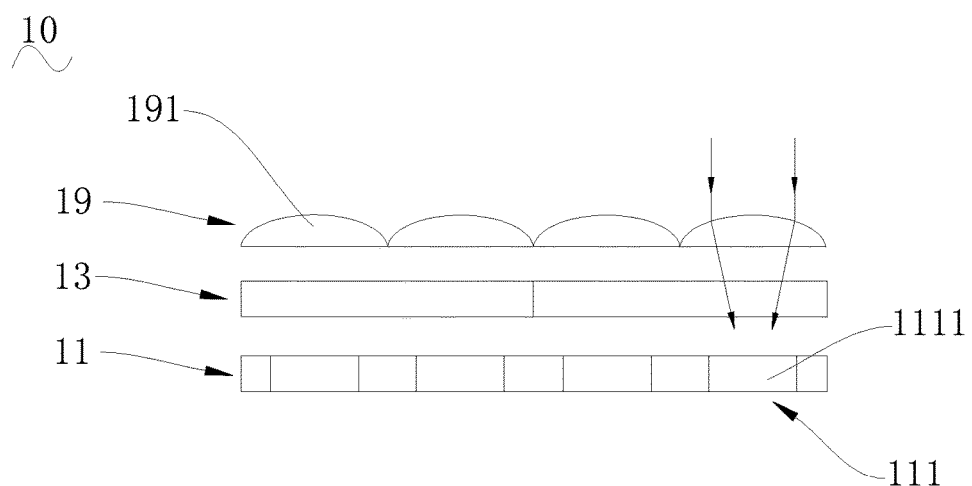
FIG. 14 is a structure diagram of an image sensor of an imaging device, according to an embodiment of the present disclosure.

Referring to FIG. 13 and FIG. 14, each micro-lens 191 corresponds to a photosensitive pixel 111, including size, position correspondence. The micro-lens 191 can converge light at the photosensitive portion 111 of the photosensitive pixel 111, to enhance the intensity of the light received by the photosensitive pixel 111, thereby improving the image quality. In some embodiments, each filter cell 1315 corresponds to 2 by 2 photosensitive pixels 111 and 2 by 2 micro-lenses 191 to form a merged pixel.

With the development of the technology, in order to get an image with a higher resolution, the photosensitive sheet has more and more photosensitive pixels 111, and has a more and more intensive arrangement of the photosensitive pixels 111. The single photosensitive pixel 111 becomes smaller and smaller, and the receiving light of the photosensitive pixel 111 is influed. And the area of the photosensitive portion 1111 of the photosensitive pixel 111 is limited. The micro-lens 191 can converge the light at the photosensitive portion 1111, to enhance the intensity of the receiving light of the photosensitive pixel 111, thereby improving the image quality.

In summary, the imaging device of the embodiments of the present disclosure, each filter cell covers a plurality of photosensitive pixels. The image processing module 30 adds the outputs of the multiple photosensitive pixels to obtain an output of the merged pixel. Compared with a traditional imaging device structure, the imaging device of this structure can generate an image having lower noise, higher signal to noise ratio, and higher definition, in a low-luminance environment.

This present disclosure also provides an electronic device using an imaging device. In some embodiments, the electronic device includes an imaging device. Therefore, the electronic device has a camera function, and can produce a merged image with a higher signal to noise ratio and higher resolution, in a low-luminance environment.

The electronic device can be a cell phone.

In some embodiments, the imaging device can be a front-facing camera of a cell phone. Because the front-facing camera is usually used for self-portrait, and the self-portrait is generally required to have a requirement for the image definition, and the requirement for the image resolution is not high. The electronic device of the present embodiment can satisfy this requirement.

Figure 15:
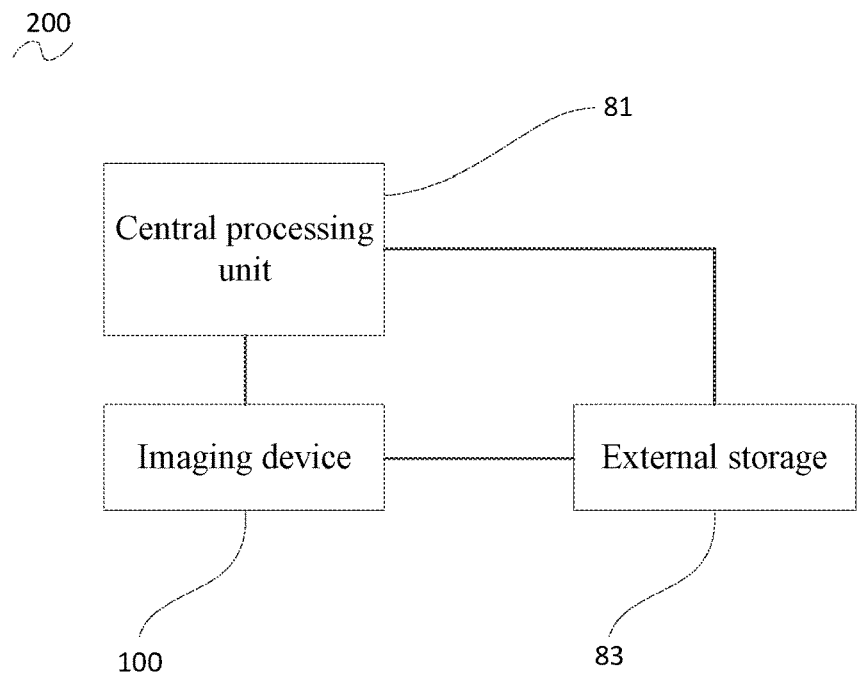
FIG. 15 is a functional block diagram of an electronic device, according to an embodiment of the present disclosure.

Referring to FIG. 15, in some embodiments, the electronic device 200 includes a central processing unit 81 and an external storage 83 connected to the imaging device 100. The central processing unit 81 is configured to control the external storage 83 to store the merged image.

In this way, the generated merged image can be stored for later viewing, use, or transfer. The external storage 83 includes a SM (Smart Media) card and a CF (Compact Flash) card, etc.

Figure 16:
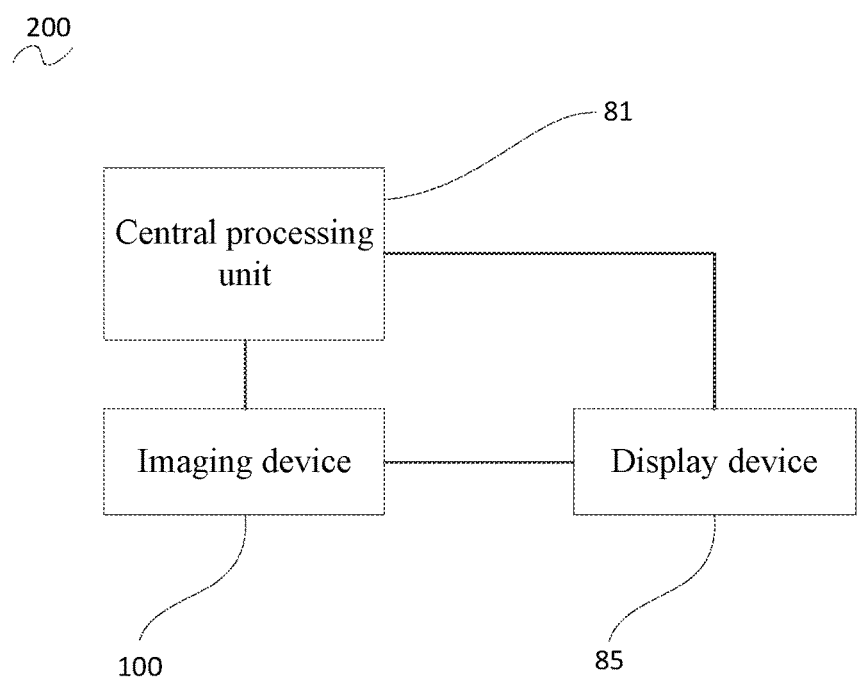
FIG. 16 is a functional block diagram of an electronic device, according to an embodiment of the present disclosure.

Referring to FIG. 16, in some embodiments, the electronic device 200 also includes a central processing unit 81 and a display device 85 connected to the imaging device 100. The central processing unit 81 is configured to control the display device 85 to display the merged image. In this way, the images captured by the electronic device 200 can be displayed with the display device 85 for viewing by users. The display device 85 includes an LED display or the like.

In summary, using the electronic device 200 of the embodiments of the present disclosure can have a camera function, and can produce a merged image with a higher signal to noise ratio and higher definition, in a low-luminance environment. Specially, when the electronic device 200 is a front-facing camera of a cell phone, it can enhance the self-portrait brightness and definition in low light.

Unexpanded portions in the imaging method and the electronic device of the embodiments of the present disclosure can refers to the corresponding portions of the imaging device of the above-mentioned embodiments, and will not be expanded in detail.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which perform the functions in a substantially simultaneous manner or in the reverse order, and not in the order shown or discussed, according to the functions involved, which should be understood by those skilled in the art.

The logic and/or steps described in other manners herein or shown in the flow chart, for example, a particular sequence table of executable instructions for realizing the logical function, may be specifically achieved in any computer-readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer-readable medium" may be any device adaptive for including, storing, communicating, propagating or transferring programs to be used by or in combination with the instruction execution system, device or equipment. More specific examples of the computer-readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device, and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks or CD, etc.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An imaging method, comprising the following steps of:
providing an imaging device comprising image sensor, the image sensor comprising a photosensitive pixel array and a filter arranged on the photosensitive pixel array, the filter comprising a filter cell array, and each filter cell covering a plurality of photosensitive pixels to form a merged pixel, and each filter cell covering 2 by 2 photosensitive pixels; and
reading outputs of the photosensitive pixel array, and adding the outputs of the photosensitive pixels of the corresponding merged pixel to obtain a pixel value of the merged pixel, thereby producing a merged image, wherein the imaging device further comprises-a register;
the step of reading further comprises:
gathering and storing the outputs of the photosensitive pixels of rows k and k+1 into the register, wherein k=2n−1, n is a natural number, k+1 is less than or equal to the total number of rows of the photosensitive pixel array; and
extracting the stored outputs of the photosensitive pixels of rows k and k+1 from the register, and adding the stored outputs of the photosensitive pixels of the corresponding merged pixel to obtain a pixel value of the merged pixel.

2. The imaging method of claim 1, wherein the step of reading further comprises:
converting analog signal outputs of the photosensitive pixels into digital signal outputs.

3. An imaging device, comprising:
an image sensor, the image sensor comprising:
a photosensitive pixel array;
a filter arranged on the photosensitive pixel array, the filter comprising a filter cell array, each filter cell covering a plurality of photosensitive pixels to form a merged pixel; and an image processing module coupled with the image sensor, and the image processing module configured to read outputs of the photosensitive pixel array, and add the outputs of the photosensitive pixels of the corresponding merged pixel to obtain a pixel value of the merged pixel, thereby producing a merged image, wherein the imaging device comprises a control module, and the control module is configured to control the line-by-line exposure of the photosensitive pixel array;

wherein the imaging device comprises a register, the control module is configured to sequentially gather the outputs of the photosensitive pixels of rows k and k+1, which are completed by current exposure, and store the outputs into the register, wherein k=2n−1, n is a natural number, and k+1 is less than or equal to the total number of rows of the photosensitive pixel array, wherein the imaging sensor comprises an analog-to-digital converter, each photosensitive pixel is connected to an analog-to-digital converter, the analog-to-digital converter is configured to convert analog signal outputs of the photosensitive pixels into digital signal outputs;

the digital signal outputs are configured to be stored in the register;

the image processing module is configured to add the digital signal outputs of the photosensitive pixels of the corresponding merged pixel to obtain a pixel value of the merged pixel.

4. The imaging device of claim 3, wherein the image sensor comprises a CMOS sensor.

5. The imaging device of claim 3, wherein the filter cell array comprises a Bayer array.

6. The imaging device of claim 3, wherein each filter cell covers 2 by 2 photosensitive pixels.

7. The imaging device of claim 3, wherein the image sensor comprises a micro-lens array arranged on the filter, and each micro-lens corresponds to a photosensitive pixel.

8. An electronic device, comprising:
the imaging device of claim 3.

9. The electronic device of claim 8, wherein the electronic device comprises a cell phone.

10. The electronic device of claim 9, wherein the imaging device comprises a front-facing camera of the cell phone.

11. The electronic device of claim 8, wherein the electronic device comprises a central processing unit and an external storage connected to the imaging device, and the central processing unit is configured to control the external storage to store the merged image.

12. The electronic device of claim 8, wherein the electronic device comprises a central processing unit and a display device connected to the imaging device, and the central processing unit is configured to control the display device to display the merged image.

13. The imaging device of claim 3, wherein the control module is connected to a row selection logic unit and a column selection logic unit, the row selection logic unit and the column selection logic unit are connected to a switch tube corresponding to each of the photosensitive pixels, and the control module is configured to control the row selection logic unit and the column selection logic unit to select a switch tube of the photosensitive pixel at a specific position.

14. The electronic device of claim 11, wherein the external storage comprises a SM (Smart Media) card and a CF (Compact Flash) card.

15. The electronic device of claim 12, wherein the display device comprises an LED display.

16. The electronic device of claim 8, wherein the image processing module comprises an image signal processing chip.

* * * * *